(12) United States Patent  
Nakamura et al.

(10) Patent No.: US 11,876,070 B2  
(45) Date of Patent: Jan. 16, 2024

(54) SEMICONDUCTOR PACKAGE MANUFACTURING METHOD

(71) Applicant: MITSUI MINING & SMELTING CO., LTD., Tokyo (JP)

(72) Inventors: Toshimi Nakamura, Ageo (JP); Tetsuro Sato, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 434 days.

(21) Appl. No.: 17/292,216

(22) PCT Filed: Nov. 11, 2019

(86) PCT No.: PCT/JP2019/044084  
§ 371 (c)(1),  
(2) Date: May 7, 2021

(87) PCT Pub. No.: WO2020/105485  
PCT Pub. Date: May 28, 2020

(65) Prior Publication Data  
US 2021/0327847 A1     Oct. 21, 2021

(30) Foreign Application Priority Data  
Nov. 21, 2018   (JP) .................... 2018-218382

(51) Int. Cl.  
 *H01L 21/50* (2006.01)  
 *H01L 23/00* (2006.01)  
 *H01L 23/12* (2006.01)  
(52) U.S. Cl.  
 CPC .............. *H01L 24/80* (2013.01); *H01L 21/50* (2013.01); *H01L 23/12* (2013.01)

(58) Field of Classification Search  
None  
See application file for complete search history.

(56) References Cited

U.S. PATENT DOCUMENTS 10,056,349 B2 * 8/2018 Ko ..................... H01L 21/311  
2015/0348818 A1 * 12/2015 Tachioka ................ B32B 9/04  
               156/247

(Continued)

FOREIGN PATENT DOCUMENTS

JP 2002-206078 A 7/2002  
JP 2005-101137 A 4/2005

(Continued)

*Primary Examiner* — Bradley Smith  
(74) *Attorney, Agent, or Firm* — Greenblum & Bernstein, P.L.C.

(57) ABSTRACT

A method for producing a semiconductor package, capable of suppressing damage of a device, and dissolving or softening a tacky layer quickly to peel off a reinforcing sheet, is provided. This method includes: providing a tacky sheet including a soluble tacky layer, making a first laminate, obtaining a second laminate having a second support substrate bonded to the first laminate, peeling off a first support substrate to obtain a third laminate, mounting a semiconductor chip thereon to obtain a fourth laminate, sealing a right end surface and a left end surface of the fourth laminate with sealing members and immersing a lower end surface of the fourth laminate selectively in a solution, giving a pressure difference between an inner space and the solution to allow the solution to penetrate into the internal space and dissolve or soften the soluble tacky layer, and peeling off the second support substrate.

19 Claims, 4 Drawing Sheets

(56) References Cited

U.S. PATENT DOCUMENTS

| | | |
|---|---|---|
| 2019/0292415 A1 | 9/2019 | Sato et al. |
| 2019/0378727 A1 | 12/2019 | Matsuura et al. |
| 2019/0378728 A1 | 12/2019 | Matsuura et al. |

FOREIGN PATENT DOCUMENTS

| | | |
|---|---|---|
| JP | 2015-35551 A | 2/2015 |
| WO | WO2018/097264 A1 | 5/2018 |
| WO | WO2018/097265 A1 | 5/2018 |
| WO | WO2018/097266 A1 | 5/2018 |

* cited by examiner

SEMICONDUCTOR PACKAGE MANUFACTURING METHOD

TECHNICAL FIELD

The present invention relates to a method for producing a semiconductor package.

BACKGROUND ART

In recent years, multilayering of a printed wiring board has widely been performed in order to increase the mounting density of the printed wiring board to reduce the size. Such a multilayer printed wiring board has been utilized in many of portable electronic devices for the purpose of reducing the weight and the size. In this multilayer printed wiring board, further reduction in thickness of an interlayer insulating layer and still further reduction in weight as a wiring board have been required.

As a technique that meets such requirements, a method for producing a multilayer printed wiring board using a coreless buildup method has been adopted. The coreless buildup method is a method in which an insulating layer and a wiring layer are alternately laminated (build up) on a so-called core (core material) by a method called a buildup method to be made into a multilayer, and the core (core material) is then removed to form a wiring board with only the buildup layers. In the coreless buildup method, using a carrier-attached copper foil in such a way that peeling-off of a support body from a multilayer printed wiring board can easily be performed has been proposed. For example, Patent Literature 1 (JP2005-101137A) discloses a method for producing a package substrate for installation to a semiconductor element, the method including: pasting an insulating resin layer to a surface of a carrier of the carrier-attached copper foil to make a support body; forming a first wiring conductor on a side of a superthin copper layer of the carrier-attached copper foil by steps of photo resist processing, pattern electrodeposited copper plating, resist stripping, and the like; thereafter, forming a buildup wiring layer; and peeling off a carrier-attached support substrate to remove the superthin copper layer.

Among others, needs for high integration and reduction in thickness of semiconductor chips and printed wiring boards are increasing with still further reduction in size and power saving in electronic devices. As a next generation packaging technique that meets such needs, adoption of FO-WLP (Fan-Out Wafer Level Packaging) and PLP (Panel Level Packaging) has been studied in recent years. Adoption of the coreless buildup method has also been studied in FO-WLP and PLP. As one of such methods, there is a method called a RDL-First (Redistribution Layer-First) method, in which a wiring layer and, if necessary, a buildup wiring layer are formed on a surface of a coreless support body, further, if necessary, the support body is peeled off, and chip mounting is thereafter performed. For example, Patent Literature 2 (JP2015-35551A) discloses a method for producing a semiconductor apparatus, the method including formation of a metal release layer on a main surface of a support body composed of glass or a silicon wafer, formation of an insulating resin layer thereon, formation of a redistribution layer thereon, the redistribution layer including a buildup layer, mounting and sealing of a semiconductor integrated circuit thereon, exposure of the release layer by removal of the support body, exposure of a secondary mounting pad by removal of the release layer and formation of a solder bump on a surface of the secondary mounting pad, and secondary mounting.

With the technological trend, such that adoption of FO-WLP and PLP is studied, in recent years, reduction in thickness of the buildup layer is required. However, in the case where the thickness of the buildup layer is thin, when a substrate is peeled off from a buildup layer-attached substrate made using a coreless buildup method, the buildup layer is curved locally and largely in some cases. Such large curvature of the buildup layer causes disconnection and peeling-off of the wiring layer inside the buildup layer, which as a result can lower the connection reliability of the wiring layer. Laminating a reinforcing sheet on a multilayer laminate to improve handleability has been proposed in order to deal with such problems. For example, Patent Literature 3 (WO2018/097265) discloses reinforcing a multilayer wiring layer so as not to be curved locally and largely by laminating a reinforcing sheet on a multilayer laminate with a soluble tacky layer interposed therebetween, and it is described that the connection reliability of the multilayer wiring layer and the coplanarity of the surface of the multilayer wiring layer can thereby be improved. In addition, Patent Literature 4 (WO2018/097266) discloses a tacky sheet including a soluble tacky layer composed in an intermittent pattern having an island shape, a stripe shape, or the like. It is also disclosed in Patent Literature 4 that when such a tacky sheet is pasted to an adherend, such as a printed wiring board, to reinforce the adherend, and the tacky sheet is then peeled off, a solution is allowed to penetrate effectively into a gap of the pattern of the soluble tacky layer to facilitate dissolution or the like of a tackiness agent, and a surfactant, an alcohol solution, or the like is added to the solution and thereby improve the penetrability.

CITATION LIST

Patent Literature

Patent Literature 1: JP2005-101137A
Patent Literature 2: JP2015-35551A
Patent Literature 3: WO2018/097265
Patent Literature 4: WO2018/097266

SUMMARY OF INVENTION

It is preferable to adopt a soluble tacky layer composed in an intermittent pattern as a tacky layer for pasting a reinforcing sheet to a redistribution layer and add a surfactant or the like to a solution capable of dissolving the soluble tacky layer (hereinafter, sometimes referred to as "dissolving solution") because of contribution to prompt peeling-off of the reinforcing sheet. However, it still takes a time for allowing the dissolving solution to penetrate, and therefore further improvements are desired. In addition, when the soluble tacky layer is dissolved or softened, a laminate in a state where a device, such as a semiconductor chip, is mounted on a redistribution layer and sealed with a resin is immersed in the dissolving solution, and therefore suppression of damage which the device and a resin-sealing material suffer due to the contact with the dissolving solution is also desired.

The present inventors have discovered that when a reinforcing sheet which has finished its role is peeled off in production of a semiconductor package, the damage of a device attributable to a dissolving solution can be suppressed, and the tacky layer can quickly be dissolved or softened by immersing a lower end surface part of a laminate selectively in the dissolving solution to allow the dissolving solution to penetrate into an inner space where a tacky layer exists by a pressure difference.

Accordingly, an object of the present invention is to provide a method for producing a semiconductor package, which is capable of suppressing the damage of a device attributable to a dissolving solution and dissolving or softening a tacky layer quickly to peel off a reinforcing sheet which has finished its role.

According to an aspect of the present invention, there is provided a method for producing a semiconductor package, the method comprising the steps of:
(a) providing a tacky sheet comprising a substrate sheet, and a soluble tacky layer provided in an intermittent pattern on at least one surface of the substrate sheet;
(b) making a first laminate comprising a redistribution layer on a first support substrate;
(c) using the tacky sheet to obtain a second laminate having a second support substrate bonded to a surface on the redistribution layer side of the first laminate with the soluble tacky layer interposed therebetween;
(d) peeling off the first support substrate from the second laminate to obtain a third laminate wherein a surface of the redistribution layer away from the second support substrate is exposed;
(e) mounting a semiconductor chip on a surface on the redistribution layer side of the third laminate and sealing the semiconductor chip with a resin to obtain a fourth laminate comprising an outer peripheral end surface composed of an upper end surface, a lower end surface, a right end surface, and a left end surface;
(f) sealing the right end surface and the left end surface of the fourth laminate with a pair of sealing members and immersing the lower end surface of the fourth laminate selectively in a solution with an angle to allow the lower end surface to face downward and allow the upper end surface to face upward;
(g) giving a pressure difference between an internal space, which is between the second support substrate and the redistribution layer of the fourth laminate, and the solution to allow the solution to penetrate into the internal space by the pressure difference, thereby dissolving or softening the soluble tacky layer; and
(h) peeling off the second support substrate from the fourth laminate in a state where the soluble tacky layer is dissolved or softened to obtain the semiconductor package.

DESCRIPTION OF EMBODIMENTS

A method for producing a semiconductor package according to the present invention includes the steps of (a) preparing a tacky sheet, (b) making a first laminate, (c) laminating a reinforcing sheet, (d) peeling off a first support substrate, (e) mounting a semiconductor chip, (f) immersion in a dissolving solution, (g) dissolving or softening a tacky layer, and (h) peeling off the reinforcing sheet.

Hereinafter, each step from the step (a) to the step (h) will be described with reference to the drawings.

(a) Preparing Tacky Sheet

Figure 3A:
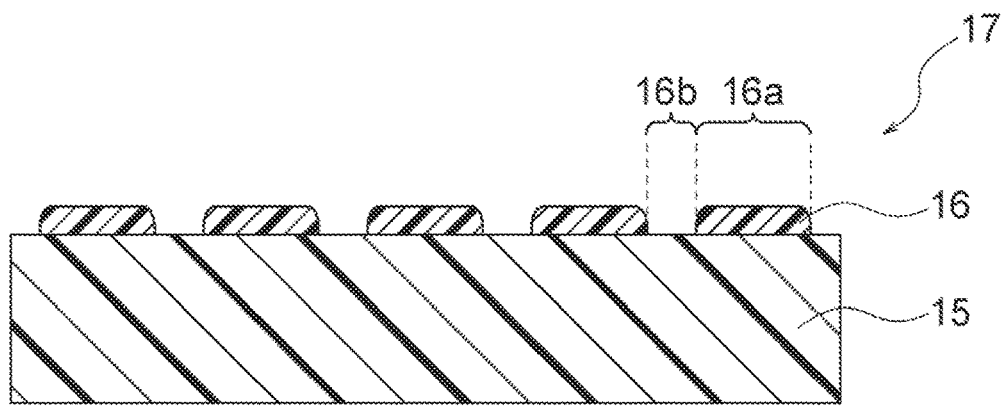
FIG. 3A is a schematic section view showing one aspect of a tacky sheet prepared in the present invention.
Figure 3B:
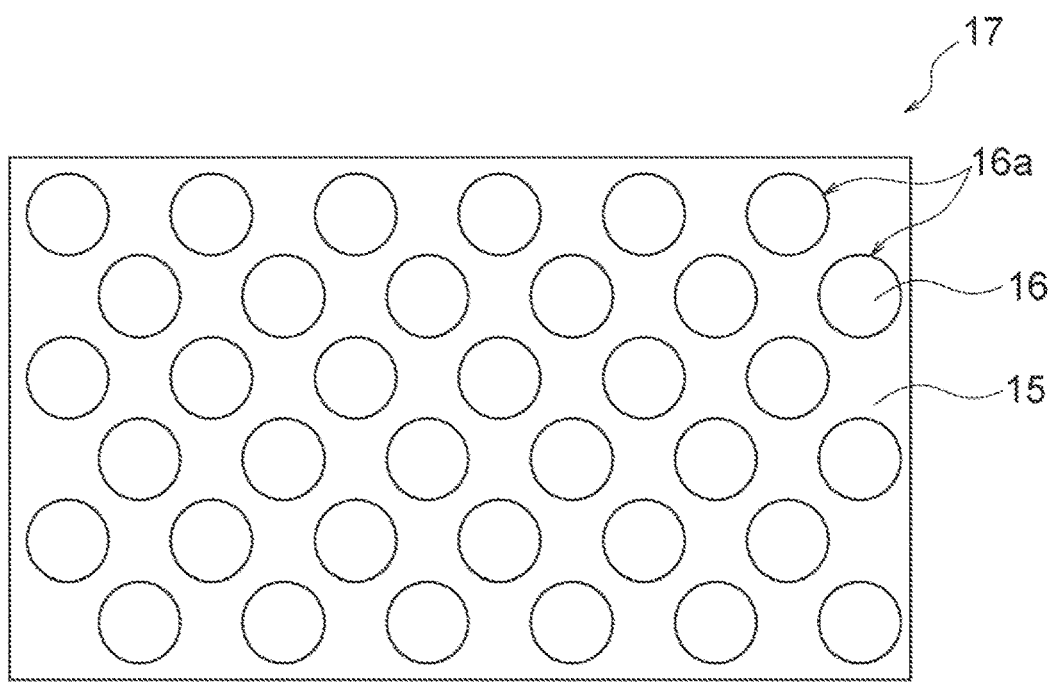
FIG. 3B is a schematic top view of the tacky sheet shown in FIG. 3A.

As shown in FIG. 3A and FIG. 3B, a tacky sheet 17 including a substrate sheet 15, a soluble tacky layer 16 provided in an intermittent pattern on at least one surface of the substrate sheet 15 is prepared. The details on the tacky sheet 17 will be described later. It is to be noted that there exist two types of tacky sheets; one is an "adhesion type tacky sheet" which is used for allowing the substrate sheet itself to adhere to an adherend with the tacky layer interposed therebetween, and the other is a "transfer type tacky sheet" which is used for imparting tackiness to an adherend or the second substrate sheet by transferring the tacky layer to the adherend or the second substrate sheet and peeling off the initial substrate sheet. In this respect, the tacky sheet 17 which is prepared in the present invention may be any of the adhesion type tacky sheet and the transfer type tacky sheet.

(b) Making First Laminate

Figure 1A:
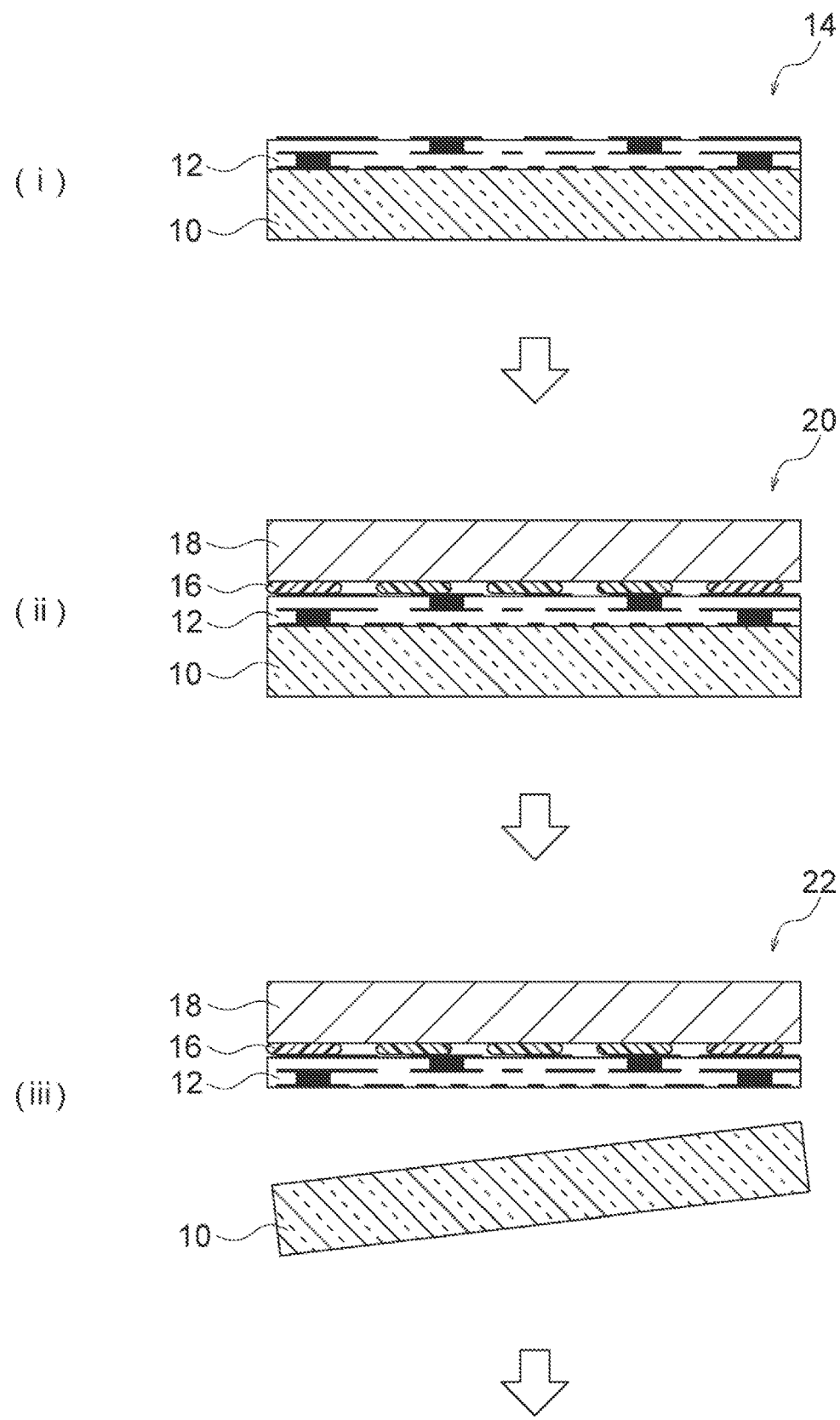
FIG. 1A is a step flow diagram showing initial steps in one example of a method for producing a semiconductor package according to the present invention.

As shown in FIG. 1A(i), a first laminate 14 including a redistribution layer 12 on a first support substrate 10. The first support substrate 10 is a base for forming the redistribution layer 12. The first support substrate 10 may be in the form of so-called carrier-attached metal foil, and a known layer composition is adoptable. The first support substrate 10 may include a substrate, a release layer, and a metal layer in the mentioned order, and for example, a laminate sheet disclosed in Patent Literature 3 (WO2018/097265) can preferably be used (the substrate of this laminate sheet can be composed of a resin film, glass, or a ceramic). In this case, the redistribution layer 12 is preferably made on the surface of the metal layer of the first support substrate 10.

In the present invention, the redistribution layer means a layer including an insulating layer and a wiring layer formed in the inside and/or on the surface of the insulating layer. For example, a chip electrode disposed on a semiconductor chip and a terminal disposed on a printed wiring board at a larger pitch than the chip electrode can be connected electrically with this redistribution layer interposed therebetween. Forming the redistribution layer 12 may be performed according to a known method and is not particularly limited. For example, the redistribution layer 12 can be formed by alternately laminating the insulation layer and the wiring layer into a multilayer by the above-described buildup method.

(c) Laminating Reinforcing Sheet

As shown in FIG. 1A(ii), the tacky sheet 17 is used to obtain a second laminate 20 having a second support substrate 18 bonded to the surface on the redistribution layer 12 side of the first laminate 14 with the soluble tacky layer 16 interposed therebetween. For example, the second support substrate 18 is pasted to the surface on the redistribution layer 12 side of the first laminate 14 using the tacky sheet 17, and the second laminate 20 can thereby be obtained. Thereby, the redistribution layer 12 can be reinforced by the second support substrate 18 in such a way as not to be curved largely. That is, the second support substrate 18 functions as a reinforcing sheet, and therefore disconnection and peeling-off of the wiring layer on the surface and/or in the inside of the redistribution layer 12 can be avoided and the connection reliability of the redistribution layer 12 can be improved. In addition, the curvature is prevented or suppressed effectively, and the coplanarity of the surface of the redistribution layer 12 can thereby be improved.

When the tacky sheet 17 is an adhesion type tacky sheet, the substrate sheet 15 itself is preferably used as the second support substrate 18 by pasting the tacky sheet 17 to the surface on the redistribution layer 12 side of the first laminate 14. On the other hand, when the tacky sheet 17 is a transfer type tacky sheet, it is preferable that, prior to bonding of the first laminate 14 and the second support substrate 18, the tacky sheet 17 be pasted to the second support substrate 18 or the first laminate 14 to transfer the soluble tacky layer 16 to the second support substrate 18 or the first laminate 14, and the substrate sheet 15 be peeled off. The transferring method is not particularly limited, and a known method, such as, for example, roll lamination, can be adopted.

The second support substrate 18 preferably has a lower Vickers hardness than the first support substrate 10. Thereby, the second support substrate 18 itself bends, and the stress that can occur during lamination or peeling-off can thereby be released well, and as a result, the curvature of the redistribution layer 12 can effectively be prevented or suppressed. The Vickers hardness of the second support substrate 18 is preferably 2% or more and 99% or less of the Vickers hardness of the redistribution layer 12, more preferably 6% or more and 90% or less, and still more preferably 10% or more and 85% or less. The second support substrate 18 preferably has a Vickers hardness of 50 HV or more and 700 HV or less, more preferably 150 HV or more and 550 HV or less, and still more preferably 170 HV or more and 500 HV or less. It is to be noted that in the present specification, the Vickers hardness is measured in accordance with "Vickers Hardness Test" described in JIS Z 2244-2009.

For reference, examples of the Vickers hardness HV for various materials that can be a candidate are given below: sapphire glass (2300 HV), cemented carbide (1700 HV), cermet (1650 HV), quartz (rock crystal) (1103 HV), SKH56 (high-speed tool steel material, high-speed steel) (722 HV), tempered glass (640 HV), SUS440C (stainless steel) (615 HV), SUS630 (stainless steel) (375 HV), JIS type 60 titanium alloys (64 titanium) (around 280 HV), Inconel (heat-resistant nickel alloy) (150 HV or more and 280 HV or less), S45C (carbon steel for machine construction) (201 HV or more and 269 HV or less), Hastelloy alloy (corrosion-resistant nickel alloy) (100 HV or more and 230 HV or less), SUS304 (stainless steel) (187 HV), SUS430 (stainless steel) (183 HV), cast iron (160 HV or more and 180 HV or less), titanium alloy (110 HV or more and 150 HV or less), brass (80 HV or more and 150 HV or less), and bronze (50 HV or more and 100 HV or less).

The material of the second support substrate 18 is not particularly limited, but a resin, a metal, glass, or a combination thereof is preferable. Examples of the resin include an epoxy resin, a polyimide resin, a polyethylene resin, and a phenol resin, and the resin may be a prepreg composed of such a resin and a fiber-reinforced material. Examples of the metal include stainless steel and a copper alloy (for example, bronze, phosphor bronze, a copper nickel alloy, and a copper titanium alloy) from the viewpoint of the Vickers hardness and the spring deflection limit $Kb_{0.1}$, but stainless steel is particularly preferable from the viewpoint of chemical resistance. The form of the second support substrate 18 is not limited to a sheet form, and the second support substrate 18 may take another form, such as a film, a plate, and a foil, as long as the curvature of the redistribution layer 12 can be prevented or suppressed, but is preferably in the form of a sheet or a plate. The second support substrate 18 may be such that these sheet, film, plate, foil, and the like are laminated. Typical examples of the second support substrate 18 include a metal sheet, a resin sheet (a hard resin sheet in particular), and a glass sheet. The second support substrate 18 preferably has a thickness of 10 µm or more and 1 mm or less, more preferably 50 µm or more and 800 µm or less, and still more preferably 100 µm or more and 600 µm or less from the viewpoint of retention of the strength of the second support substrate 18 and easiness of handling of the second support substrate 18. When the second support substrate 18 is a metal sheet (for example, a stainless steel sheet), the surface on the side where the metal sheet adheres to the soluble tacky layer 16 preferably has a ten-point average roughness Rz-jis (measured in accordance with JIS B 0601-2001) of 0.05 µm or more and 500 µm or less, more preferably 0.5 µm or more and 400 µm or less, and still more preferably 1 µm or more and 300 µm or less. When the metal sheet has such a surface roughness, it is considered that the adhesion of the metal sheet to the soluble tacky layer 16 is enhanced by the anchor effect due to the unevenness of the surface and moderate peel strength in the soluble tacky layer 16 is realized.

(d) Peeling Off First Support Substrate

As shown in FIG. 1A(iii), the first support substrate 10 is peeled off from the second laminate 20 to obtain a third laminate 22 wherein the surface of the redistribution layer 12, the surface being on the side away from the second support substrate 18, is exposed. Thereby, for example, the substrate, the release layer, and the like composing the first support substrate 10 are peeled off and removed from the redistribution layer 12. This peeling-off/removal is preferably performed by physical peeling-off. The physical peeling-off method is a method of separation by peeling off the first support substrate 10 from the redistribution layer 12 by hand, a tool, a machine, or the like. On this occasion, when the second support substrate 18 adhering to the redistribution layer 12 with the soluble tacky layer 16 interposed therebetween reinforces the redistribution layer 12, it can thereby be prevented that the redistribution layer 12 is curved locally and largely. That is, the second support substrate 18 reinforces the redistribution layer 12 in such a way as to resist the peeling-off force during peeling off the first support substrate 10 and can prevent or suppress the curvature still further effectively. In this way, the disconnection and peeling-off of the wiring layer in the inside and/or on the surface of the redistribution layer 12, which are caused by the curvature in some cases, can be avoided and the connection reliability of the redistribution layer 12 can be improved. In addition, when the curvature is prevented or suppressed effectively, the coplanarity of the surface of the redistribution layer 12 can thereby be improved. It is to be noted that when the first support substrate 10 includes a metal layer, the metal layer which can be left on the surface of the third laminate 22 after peeling off the first support substrate 10 is preferably etched away. Etching the metal layer may be performed based on a known method, such as flush etching.

(e) Mounting Chip

Figure 1B:
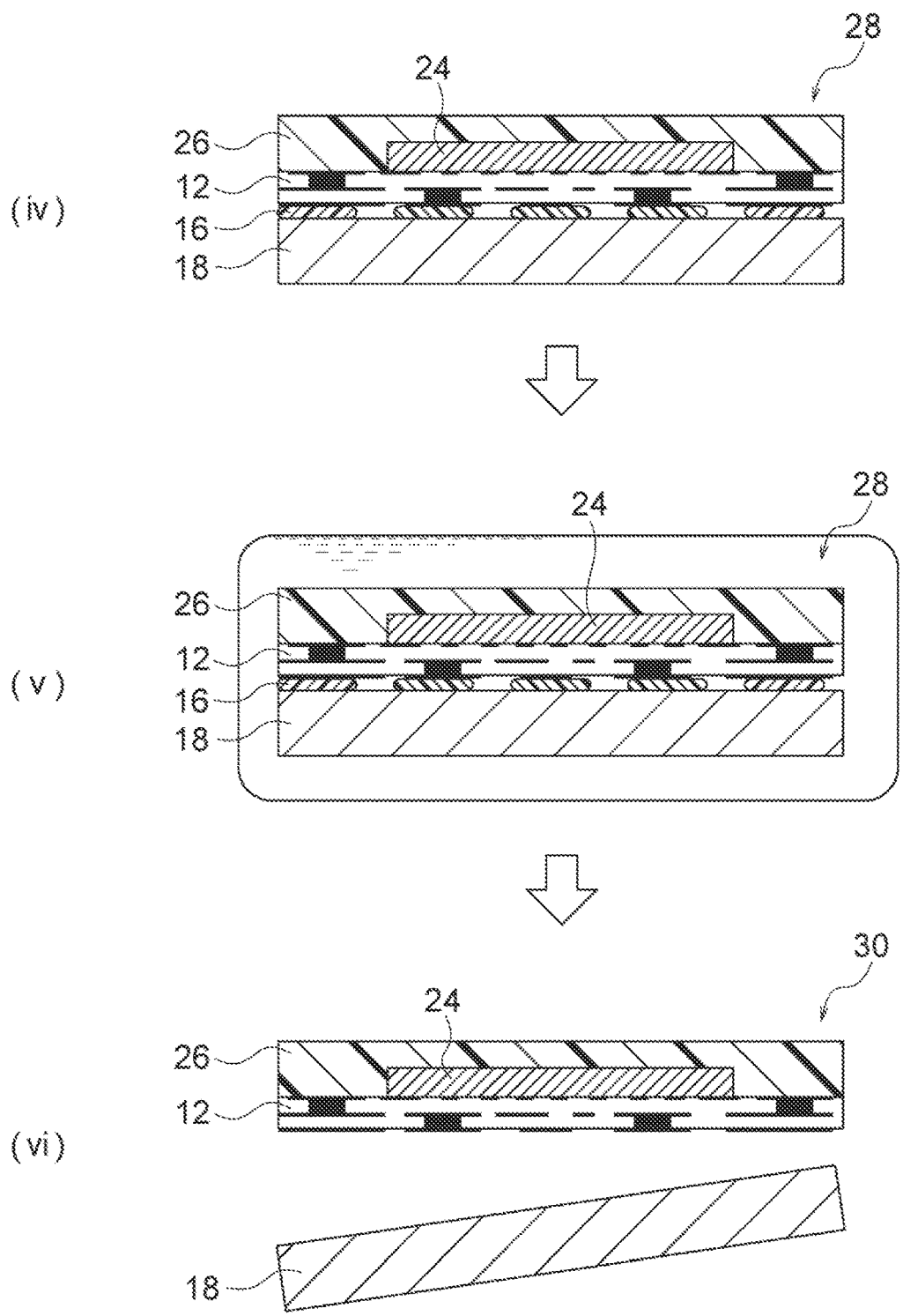
FIG. 1B is a step flow diagram showing steps following the steps shown in FIG. 1A in one example of a method for producing a semiconductor package according to the present invention.

As shown in FIG. 1B(iv), a semiconductor chip 24 is mounted on the surface on the redistribution layer 12 side of the third laminate 22, and the semiconductor chip 24 is sealed with a resin using a sealing material 26 to obtain a fourth laminate 28 including an outer peripheral end surface composed of an upper end surface, a lower end surface, a right end surface, and a left end surface. In the method of the present invention, the second support substrate 18 is laminated on the surface of the redistribution layer 12 with the soluble tacky layer 16 interposed therebetween, and excellent coplanarity which is advantageous to mounting of the semiconductor chip 24 can thereby be realized on the surface of the redistribution layer 12, the surface on the side away from the second support substrate 18. That is, the redistribution layer 12 is not curved locally and largely by the second support substrate 18 also during mounting the semiconductor chip 24. As a result, the yield of connection of the semiconductor chip 24 can be increased. It is to be noted that the lengths of the respective end surfaces of the fourth laminate 28 may be different from one another. For example, when the fourth laminate 28 has a rectangular shape, both end surfaces on the long-side sides may be set as the upper end surface and the lower end surface, respectively, or both end surfaces on the short-side sides may be set as the upper end surface and the lower end surface, respectively. In this respect, when suction is performed using a pump connected to the upper end surface of the fourth laminate 28 in the step of dissolving or softening the tacky layer, which will be described later, both end surfaces on the long-side sides are preferably set as the upper end surface and the lower end surface, respectively, from the viewpoint of expanding the suction area.

A pre-treatment may be performed on the surface of the redistribution layer 12 away from the second support substrate 18, prior to chip mounting, and examples of such a pre-treatment include formation of an electrode (for example, a columnar electrode) for connection with a chip electrode disposed on a semiconductor chip. Formation of the electrode may be performed using a known method and can preferably be performed by, for example, formation of selective electrodeposited copper plating using a dry film resist Examples of the semiconductor chip 24 include a semiconductor element, a chip capacitor, and a resistor. Examples of the chip mounting system include a flip chip mounting system and a die bonding system. The flip chip mounting system is a system of connecting a mounting pad of the semiconductor chip 24 and a wiring layer of the redistribution layer 12. A columnar electrode (pillar), a solder bump, or the like may be formed on this mounting pad, and NCF (Non-Conductive Film) or the like, which is a sealing resin film, is pasted to the surface of the redistribution layer 12 before mounting. In addition, the connection is preferably performed using a low-melting-point metal, such as solder, but an anisotropic conductive film or the like may also be used. The die bonding adhesion system is a system of allowing the surface on the side opposite to the surface of the mounting pad of the semiconductor chip 24 to adhere to the wiring layer. A paste or a film which is a resin composition containing a thermosetting resin and a thermally conductive inorganic filler is preferably used for this adhesion. In any of the systems, the semiconductor chip 24 is sealed with a resin using a sealing material 26 as shown in FIG. 1B(iv). Thereby, the rigidity of the laminate of the redistribution layer 12 and the semiconductor chip 24 as a whole can further be improved. The sealing material 26 may be composed of a known material (such as, for example, an epoxy resin) which is used for resin-sealing of a semiconductor chip and is not particularly limited.

(f) Immersion in Solution

Figure 2A:
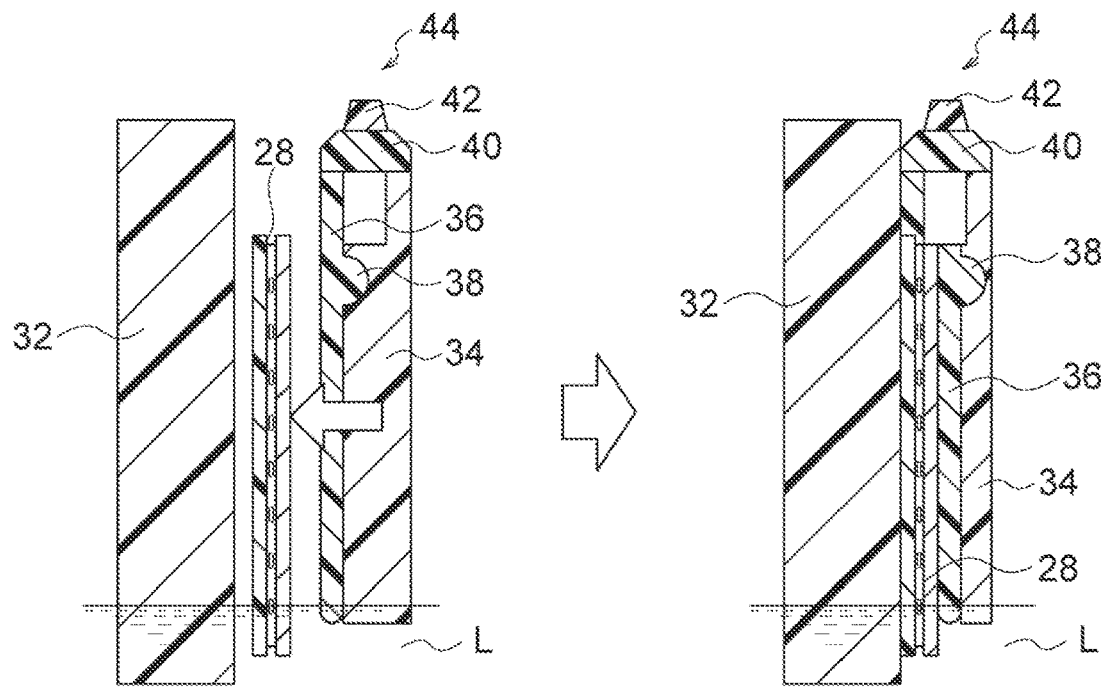
FIG. 2A is a schematic section view for describing fixation and immersion of a fourth laminate plate using a suction tool and a back plate.
Figure 2B:
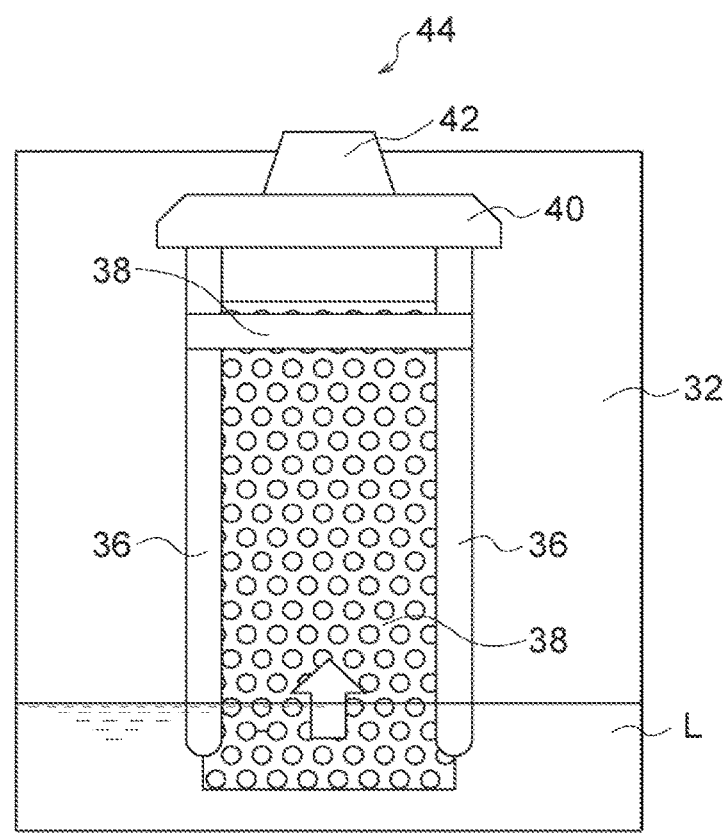
FIG. 2B is a schematic front view obtained by observing a structure including the fourth laminate plate shown in FIG. 2A from the front plate side of the suction tool in a state where the front plate and the like are detached.

As shown in FIG. 1B(v), a part of the fourth laminate 28 is immersed in a solution (namely, a dissolving solution) capable of dissolving the soluble tacky layer 16. This operation is performed by sealing the right end surface and the left end surface of the fourth laminate 28 with a pair of sealing members 36 and immersing the lower end surface of the fourth laminate 28 selectively in a solution L with an angle to allow the lower end surface to face downward and allow the upper end surface to face upward as shown in FIG. 2A and FIG. 2B. Thereby, when the solution L is allowed to penetrate into the internal space between the second support substrate 18 and the redistribution layer 12 (hereinafter, sometimes simply referred to as "internal space") in the step of dissolving or softening the tacky layer, which will be described later, the solution L spreads uniformly from the lower end surface toward the upper end surface without leaking out from the right and left end surfaces of the fourth laminate 28. As a result, the dissolution or softening of the soluble tacky layer 16 can efficiently be performed. Further, in the method of the present invention, the lower end surface of the fourth laminate 28 is immersed selectively in the solution L, and therefore the damage which the semiconductor chip 24 and the sealing material 26 suffer due to the contact with the solution L is suppressed effectively as compared to the case where the whole of the fourth laminate 28 is immersed in the solution L. In this respect, in the conventional methods, for example, a dissolving solution in a pH region that is unlikely to give an adverse effect to a device and the like has been used, so that the type of the dissolving solution which can be used has been limited. On the other hand, in the method of the present invention, the damage which the semiconductor chip 24 and the like suffer can be suppressed by adopting the aspect, and therefore a dissolving solution having a characteristic of being capable of dissolving the soluble tacky layer 16 more effectively can flexibly be adopted.

From the above-described viewpoint, when the length from the lower end surface to the upper end surface of the fourth laminate 28 is assumed to be 100%, only a lower region within a range of more than 0% and 90% or less in terms of length from the lower end surface is preferably immersed in the solution L, more preferably 1% or more and 70% or less, still more preferably 1% or more and 50% or less, further still more preferably 1% or more and 30% or less, particularly preferably 2% or more and 20% or less, particularly more preferably 2% or more and 10% or less, and most preferably 2% or more and 5% or less. In addition, from the viewpoint similar to that described above, only a lower region within a range of 200 mm in terms of length from the lower end surface of the fourth laminate 28 is preferably immersed in the solution L, more preferably 100 mm, still more preferably 50 mm, further still more preferably 30 mm, particularly preferably 20 mm, particularly more preferably 10 mm, and most preferably 5 mm.

From the viewpoint of preventing deformation of the fourth laminate 28 and sealing the right end surface and the left end surface of the fourth laminate 28 more surely, one surface side of the fourth laminate 28 is preferably brought into contact with a back plate 32 to fix the fourth laminate 28. The surface of the fourth laminate 28, which is brought into contact with the back plate 32 may be on the redistribution layer 12 side or on the second support substrate 18 side. More preferably, sealing is performed by sandwiching the fourth laminate 28 between a suction tool 44 and the back plate 32 as shown in FIG. 2A. The suction tool 44 includes a front plate 34, a pair of sealing members 36, a second sealing member 38, an upper cap 40, and a suction port 42. The pair of sealing members 36 is provided on the front plate 34 separately and in parallel with each other. The second sealing member 38 is provided on the front plate 34 by being bridged between the pair of sealing members 36 and takes the role of generating a pressure difference between the internal space, which is between the second support substrate 18 and the redistribution layer 12 of the fourth laminate 28, and the solution L to facilitate the penetration of the solution L into the internal space. The upper cap 40 is connected to the upper end of the front plate 34 and/or the upper end of the pair of sealing members 36 and enables formation of a closed space for reducing pressure together with the front plate 34, the pair of sealing members 36, the second sealing member 38, and the back plate 32. The suction port 42 is provided at the upper cap 40. A pump (not shown) is connected to the suction port 42. By using the suction tool 44 which has simple composition and is easily detachable in this way, the dissolution or softening of the soluble tacky layer 16 can be performed still further efficiently.

Preferred examples of the sealing members (namely, the sealing members including both of the pair of sealing members 36 and the second sealing member 38) include a member made of rubber, an adhesion film, an elastomer, and combinations thereof, and more preferably a member made of rubber. From the viewpoint of improving the adhesion to the fourth laminate 28, preferred examples of the rubber composing the member made of rubber include EPDM (ethylene propylene diene rubber), silicone rubber, fluorine-containing rubber, and combinations thereof, and more preferably silicone rubber. In addition, the adhesion to the fourth laminate 28 can be enhanced still further by using sealing members having excellent surface smoothness. From this viewpoint, the sealing members preferably have a maximum height Rz, measured in accordance with JIS B0601-2001, on a surface to be in contact with the fourth laminate 28 of 0.01 µm or more and 500 µm or less, more preferably 0.02 µm or more and 100 µm or less, still more preferably 0.03 µm or more and 60 µm or less, and particularly preferably 0.05 µm or more and 20 µm or less.

The back plate 32 preferably has alkali resistance. This is because the back plate 32 is also supposed to come into contact with the solution L as shown in FIG. 2A and FIG. 2B, the soluble tacky layer 16 preferably contains an alkali-soluble resin as will be described later, and in this case, an alkali solution is typically used as the solution L. From this viewpoint, the back plate 32 is preferably composed of vinyl chloride. In addition, from the viewpoint of enhancing the adhesion to the fourth laminate 28 still further, the back plate 32 preferably has a maximum height Rz, measured in accordance with JIS B0601-2001, on a surface to be contact with the fourth laminate 28 of 0.01 µm or more and 500 µm or less, more preferably 0.02 µm or more and 100 µm or less, still more preferably 0.03 µm or more and 60 µm or less, and particularly preferably 0.05 µm or more and 20 µm or less.

As the solution L, a solution having a desired dissolving power may appropriately be selected according to the material of the soluble tacky layer 16, and the solution L is not particularly limited. For example, when the soluble tacky layer 16 contains an alkali-soluble resin, an alkaline solution may be used as the solution L. Examples of such an alkali solution include a sodium hydroxide solution and/or a potassium hydroxide solution. These solution preferably has a concentration of 0.5% by weight or more and 50% by weight or less. When the concentration is within this range, the alkalinity is high, so that the dissolving power is improved, and sodium hydroxide and/or potassium hydroxide is difficult to deposit even when the room temperature during using the dissolving solution is low. In addition, an organic substance (for example, ethanolamine), the aqueous solution of which shows alkalinity, may be used singly or together with the solution. It is to be noted that, as will be described later, when an alkali is added to the soluble tacky layer 16 in advance, water or an aqueous solution may be used as the dissolving solution.

An organic solvent (for example, 2-propanol) capable of dissolving an acrylic resin and/or a novolak resin may be added to the alkaline solution in order to shorten the dissolution time of the soluble tacky layer 16. A preferred amount of this organic solvent added is 5% by weight or more and 50% by weight or less based on 100% by weight of the alkaline solution. When the amount added is within this range, shortening of the dissolution time is desirably realized, and the amount volatilized during operation is reduced; therefore, the concentration of the alkaline substance is easily controlled and the safety is improved. A preferred organic solvent is an alcohol, and preferred examples of the alcohol include 2-propanol, methanol, ethanol, and 2-butanol.

An appropriate amount of a surfactant may be added to the alkaline solution. The penetrability and the wettability of the solution to a resin are improved by the addition of the surfactant, and therefore further shortening of the dissolution time of the soluble tacky layer 16 can be achieved. The type of the surfactant is not particularly limited, and any surfactant may be used. For example, as a water-soluble surfactant, any of anionic surfactants, cationic surfactants, and nonionic surfactants can be used.

(g) Dissolving or Softening Tacky layer

A pressure difference is given between the internal space, which is between the second support substrate 18 and the redistribution layer 12 of the fourth laminate 28, and the solution L in a state where the lower end surface of the fourth laminate 28 is immersed in the solution L to allow the solution L to penetrate into the internal space. The soluble tacky layer 16 is dissolved or softened in this way. That is, the solution L existing near the lower end surface of the fourth laminate 28 moves upward in the internal space toward the upper end surface side of the fourth laminate 28 by reducing pressure in the internal space of the fourth laminate 28 and/or pressurizing the solution L. As a result, the internal space is filled with the solution L, and the soluble tacky layer 16 existing in the internal space and the solution L come into contact with each other, thereby the soluble tacky layer 16 dissolves or softens. In this respect, since the soluble tacky layer 16 is composed of an intermittent pattern, the solution L penetrates effectively into the gaps of the intermittent pattern of the soluble tacky layer 16 and the dissolution or softening of the soluble tacky layer 16 is facilitated. In this way, penetration of the dissolving solution is forcibly performed by giving a pressure difference between the internal space where the soluble tacky layer 16 exists and the dissolving solution in the method of the present invention, and therefore the dissolution or softening of the tacky layer can be performed in an extremely short time as compared to the convention methods in which a dissolving solution is allowed to penetrate gradually into the gap of the tacky layer by means of a capillary phenomenon by immersing the whole laminate in the dissolving solution.

From the viewpoint of allowing the solution L to penetrate quickly into the internal space, the pressure difference between the internal space and the solution L is preferably 5 kPa or more by measurement with a pressure gauge, more preferably 20 kPa or more and 100 kPa or less, still more preferably 40 kPa or more and 100 kPa or less, and particularly preferably 60 kPa or more and 100 kPa or less.

As described above, the pressure difference may be given by pressurizing the solution L, but is preferably given by reducing pressure in the internal space in that the pressure difference can be realized with simple composition. That is, the reduction of pressure in the internal space can preferably be performed using a pump connected to the upper end surface of the fourth laminate 28. Examples of a preferred pump include an ejector pump, a rotary pump, a diaphragm pump, an aspirator pump, and combinations thereof. The reduction of pressure may be performed by connecting a pump directly to the upper end surface of the fourth laminate 28, but, as shown in FIG. 2A and FIG. 2B, the reduction of pressure is preferably performed by forming a closed space for reducing pressure at the upper end part of the fourth laminate 28 with the suction tool 44 and connecting a pump to the suction port 42 of the suction tool 44.

(h) Peeling Off Reinforcing Sheet

As shown in FIG. 1B(vi), in a state where the soluble tacky layer 16 is dissolved or softened, the second support substrate 18 is peeled off from the fourth laminate 28 to obtain a semiconductor package 30. The second support substrate 18 is in a state of extremely easily peeling off due to the dissolution or softening of the soluble tacky layer 16 and therefore can be separated extremely easily by peeling off the second support substrate 18 lightly from the fourth laminate 28 by hands, a tool, a machine, or the like. It is to be noted that the second support substrate 18 may be in a state of peeling off naturally due to the dissolution of the soluble tacky layer 16. In any case, according to the method of the present invention, the stress which is given to the redistribution layer 12 is minimized, and the second support substrate 18 can be peeled off in an extremely short time. In this way, the stress applied to the redistribution layer 12 is minimized, and the disconnection of wiring and the disconnection of the mounted portion in the redistribution layer 12 can effectively be avoided.

Tacky Sheet

As described above with reference to FIG. 3A and FIG. 3B, the tacky sheet 17 which is used in the method of the present invention includes the substrate sheet 15, and the soluble tacky layer 16 provided in an intermittent pattern on at least one surface of the substrate sheet 15. The soluble tacky layer 16 may be provided on both surfaces of the substrate sheet 15. The intermittent pattern means a shape such that the soluble tacky layer 16 exists intermittently (disconnectedly) and is formed by tacky regions 16a wherein the soluble tacky layer 16 exists and a non-tacky region 16b (for example, space) wherein the soluble tacky layer 16 does not exist. The intermittent pattern is preferably an island-shaped or stripe-shaped pattern, and is more preferably an island-shaped pattern. The island-shaped pattern means a shape such that each tacky region 16a is surrounded by the non-tacky region 16b existing around the tacky region 16a. Examples of the specific shape of each tacky region 16a composing the island-shaped pattern include various shapes, such as a polygon and a circle, and the shape of each tacky region 16a may a polygon such that linear profile lines are complicated, such as a star-shaped polygon, or a heteromorphic shape such that curved profile lines are complicated.

When the soluble tacky layer 16 composes an island-shaped pattern, the circumscribed circle of each tacky region 16a preferably has a diameter of 0.1 mm or more and 10 mm or less, more preferably 0.1 mm or more and 5.0 mm or less, and still more preferably 0.1 mm or more and 2.0 mm or less. In addition, when the soluble tacky layer 16 composes a stripe-shaped pattern, each tacky region 16a preferably has a stripe width of 0.1 mm or more and 10 mm or less, more preferably 0.1 mm or more and 5.0 mm or less, and still more preferably 0.1 mm or more and 2.0 mm or less. When the diameter or the stripe width is within such a range, penetration of the dissolving solution into the gaps of the pattern of the soluble tacky layer 16 is facilitated and the peeling-off of the second support substrate 18 from the redistribution layer 12 by means of peeling-off by dissolution, or by other methods can be made easy even though the tack force by the soluble tacky layer 16 before the immersion into the dissolving solution is secured sufficiently. The island-shaped pattern is preferably a dot pattern, and the shape of each dot is typically a circle, but each dot may have a shape close to a circle. The dot diameter, which is defined as a dimeter of a circumscribed circle of each dot composing the dot pattern, is preferably 10 mm or less, more preferably 0.1 mm or more and 5.0 mm or less, and still more preferably 0.1 mm or more and 2.0 mm or less. Thereby, the surface area of the soluble tacky layer 16 is increased to improve the dissolvability, so that the peelability is improved.

The soluble tacky layer 16 preferably has a thickness of 0.5 μm or more and 50 μm or less, more preferably 1.0 μm or more and less than 30 μm, still more preferably 1.0 μm or more and 20 μm or less, particularly preferably 2.0 μm or more and 15 μm or less, and most preferably 3.0 μm or more and 10 μm or less. When the soluble tacky layer 16 has a thickness within the range, the dissolving solution penetrates quickly into the gaps of the pattern of the soluble tacky layer 16, and therefore the dissolution or softening of the soluble tacky layer 16 is facilitated, and impression of the intermittent pattern to the redistribution layer 12 can be reduced. Particularly in the production of a semiconductor package, when chip mounting, solder reflow, compression molding are performed after the second support substrate 18 is pasted to the redistribution layer 12 with the soluble tacky layer 16 interposed therebetween to reinforce the redistribution layer 12, impression attributable to the soluble tacky layer 16 is left on the redistribution layer 12 in some cases, but when the soluble tacky layer 16 has a thickness of 7.0 μm or less, there is an advantage that the impression is unlikely to be left on the redistribution layer 12 after the compression molding. In this respect, when the soluble tacky layer 16 is formed in a dot pattern, it is particularly preferable that the dot diameter be 0.7 mm or less, and the soluble tacky layer 16 have a thickness of 1.0 μm or more and 7.0 μm or less because both of the reduction in impression and the peelability can be realized more effectively.

The intervals between the centers of the circumscribed circles in the tacky region 16a are preferably larger than the average value of the diameters of the circumscribed circles in that sufficient gaps can be secured among the individual tacky regions 16a. From such a viewpoint, the intervals between the centers of the circumscribed circles in the tacky region 16a are preferably more than 0.1 mm and 20 mm or less, more preferably 0.2 mm or more and 10 mm or less, still more preferably 0.3 mm or more and 5.0 mm or less, and particularly preferably 0.4 mm or more and 2.0 mm or less. The dissolving solution penetrates quickly into the gaps of the pattern in the soluble tacky layer 16 by setting the intervals to such a range, and therefore the peelability is improved.

The island-shaped pattern may be composed of one cluster or a plurality of clusters that give a polygonal, circular, ring-shaped, band-shaped, or lattice-shaped pattern as a whole, and each of the clusters can be composed of an aggregate of three or more tacky regions 16a.

The soluble tacky layer 16 is a layer that not only exhibits tackiness at room temperature but also can dissolve or soften by coming into contact with the dissolving solution. Accordingly, the soluble tacky layer 16 preferably contains a solution-soluble resin, and contains, for example, an acid-soluble resin or an alkali-soluble resin. This solution-soluble resin can dissolve or soften more efficiently by the contact with the dissolving solution, and therefore the peeling-off of the second support substrate 18 from the redistribution layer 12 can be performed more effectively.

A preferred solution-soluble resin is an alkali-soluble resin. This is because in the production of a semiconductor package, use of a neutral or acidic solution is supposed in a rinsing step or the like and it is therefore desired that the solution-soluble resin do not dissolve in the neutral or acidic solution. The alkali-soluble resin particularly preferably contains a polymer containing at least one of a carboxyl group and a phenolic hydroxy group. Such a polymer dissolves easily in an alkaline solution in particular and therefore facilitates the dissolution of the soluble tacky layer 16 to enable the peeling-off of the second support substrate 18 from the redistribution layer 12 in a shorter time. Examples of the polymer containing at least one of a carboxyl group or a phenolic hydroxy group include an acrylic resin containing a carboxyl group and a phenol novolak resin containing a phenolic hydroxy group. An acrylic resin-based tackiness agent can be synthesized by copolymerizing an acrylic monomer (for example, acrylic acid or methacrylic acid) having a carboxyl group and having an unsaturated double bond within the molecule, and ethyl acrylate or butyl acrylate. In the synthesis, the tack force and solubility to an alkaline solution of the soluble tacky layer 16 can be controlled by adjusting the type and ratio of the acrylic monomer. In addition, the tack force and solubility to an alkaline solution of the soluble tacky layer 16 can also be controlled by adding, to the acrylic resin containing a carboxyl group, a resin (for example, epoxy resin) that causes a cross-linking reaction of the carboxyl group. That is, when part of carboxyl groups in the acrylic resin is cross-linked by a resin, such as an epoxy resin, the molecular weight thereby increases, and therefore the heat resistance is improved but the tack force is lowered, and the solubility to the alkaline solution is lowered. On the other hand, when the phenol novolak resin containing a phenolic hydroxy group is used as the alkali-soluble resin, moderate tackiness is preferably imparted by mixing a tackifier, such as rosin, because the tack force of the soluble tacky layer 16 is weak if this resin is used singly.

An alkali may be added to the alkali-soluble resin in advance. Thereby, the soluble tacky layer 16 can be dissolved or softened using water or an aqueous solution as the dissolving solution. That is, when the soluble tacky layer 16 comes into contact with water or the aqueous solution, the acidity or alkalinity of the water or the like is thereby changed into alkalinity by the alkali added in advance, and the soluble tacky layer 16 containing an alkali-soluble resin can thereby be dissolved or softened.

The form of the substrate sheet 15 is not limited to what is generally called a sheet, or may be another form, such as a film, a plate, and a foil. The substrate sheet 15 may be such that these sheet, film, plate, foil, and the like are laminated. In addition, a surface treatment may be performed in advance on a surface of the substrate sheet 15, on which the soluble tacky layer 16 is to be applied, by a known method, such as a polishing treatment, an application of a mold-release agent, or a plasma treatment, in order to adjust the adhesion force between the substrate sheet 15 and the soluble tacky layer 16.

According to a preferred aspect of the present invention, the substrate sheet 15 is preferably composed of at least one resin of polyethylene terephthalate (PET) and polyethylene (PE), and more preferably polyethylene terephthalate (PET). Particularly when the tacky sheet 17 is used as a transfer type tacky sheet, the substrate sheet 15 desirably has a function of retaining the soluble tacky layer 16 and has a function of transferring the soluble tacky layer 16 to the second support substrate 18 which is prepared separately, and the substrate sheet 15 of the present aspect is suitable for such a use. When the tacky sheet 17 is used as a transfer type tacky sheet, the substrate sheet 15 preferably has a thickness of 10 μm or more and 200 μm or less, more preferably 20 μm or more and 150 μm or less, and still more preferably 25 μm or more and 75 μm or less. On the other hand, when the tacky sheet 17 is used as an adhesion type tacky sheet, the substrate sheet 15 may be selected in accordance with the second support substrate 18, and the preferred aspect of the second support substrate 18, descried above, applies to the substrate sheet 15 without change. That is, when the tacky sheet 17 is used as an adhesion type tacky sheet, the function as a reinforcing sheet that improves the handleability of the redistribution layer 12 and prevents or suppresses the curvature of the redistribution layer 12 in the steps of producing a semiconductor package is desired in the substrate sheet 15 in addition to the function of retaining the soluble tacky layer 16, and the substrate sheet 15 of the present aspect is suitable for such a use.

The invention claimed is:

1. A method for producing a semiconductor package, the method comprising:
   (a) providing a tacky sheet comprising a substrate sheet, and a soluble tacky layer provided in an intermittent pattern on at least one surface of the substrate sheet;
   (b) making a first laminate comprising a redistribution layer on a first support substrate;
   (c) using the tacky sheet to obtain a second laminate having a second support substrate bonded to a surface on the redistribution layer side of the first laminate with the soluble tacky layer interposed therebetween;
   (d) peeling off the first support substrate from the second laminate to obtain a third laminate wherein a surface of the redistribution layer away from the second support substrate is exposed;
   (e) mounting a semiconductor chip on a surface on the redistribution layer side of the third laminate and sealing the semiconductor chip with a resin to obtain a fourth laminate comprising an outer peripheral end surface composed of an upper end surface, a lower end surface, a right end surface, and a left end surface;
   (f) sealing the right end surface and the left end surface of the fourth laminate with a pair of sealing members and immersing the lower end surface of the fourth laminate selectively in a solution with an angle to allow the lower end surface to face downward and allow the upper end surface to face upward;
   (g) giving a pressure difference between an internal space, which is between the second support substrate and the redistribution layer of the fourth laminate, and the solution to allow the solution to penetrate into the internal space by the pressure difference, thereby dissolving or softening the soluble tacky layer; and (h) peeling off the second support substrate from the fourth laminate in a state where the soluble tacky layer is dissolved or softened to obtain the semiconductor package.

2. The method according to claim 1, wherein in (f), when a length from the lower end surface to the upper end surface of the fourth laminate is assumed to be 100%, only a lower region within a range of more than 0% and 90% or less in terms of length from the lower end surface is immersed in the solution.

3. The method according to claim 1, wherein (f) comprises bringing a one surface side of the fourth laminate into contact with a back plate to fix the fourth laminate.

4. The method according to claim 1, wherein the pressure difference in the step (g) is 5 kPa or more.

5. The method according to claim 1, wherein the pressure difference in (g) is given by reducing pressure in the internal space using a pump connected to the upper end surface of the fourth laminate.

6. The method according to claim 5, wherein the pump is at least one selected from the group consisting of an ejector pump, a rotary pump, a diaphragm pump, and an aspirator pump.

7. The method according to claim 5, wherein (f) is performed by sandwiching the fourth laminate between a suction tool and the back plate, wherein the suction tool comprises:

a front plate;

the pair of sealing members provided on the front plate separately and in parallel with each other;

a second sealing member provided on the front plate in such a way as to be bridged between the pair of the sealing members;

an upper cap connected to an upper end of the front plate and/or an upper end of the pair of sealing members, the upper cap being capable of forming a closed space for reducing pressure together with the front plate, the pair of sealing members, the second sealing member, and the back plate; and a suction port provided at the upper cap, and wherein the pump is connected to the suction port.

8. The method according to claim 1, wherein the sealing members each are at least one selected from a member made of rubber, an adhesion film, and an elastomer.

9. The method according to claim 8, wherein the sealing members are the members made of rubber, and the rubber is at least one selected from the group consisting of EPDM, silicone rubber, and fluorine-containing rubber.

10. The method according to claim 1, wherein the sealing members have a maximum height Rz, measured in accordance with HS B0601-2001, on a surface to be in contact with the fourth laminate of 0.01 μm or more and 500 μm or less.

11. The method according to claim 1, wherein the back plate has alkali resistance.

12. The method according to claim 11, wherein the back plate is composed of vinyl chloride.

13. The method according to claim 1, wherein the back plate has a maximum height Rz, measured in accordance with JIS B0601-2001, on a surface to be in contact with the fourth laminate of 0.01 μm or more and 500 μm or less.

14. The method according to claim 1, wherein the soluble tacky layer comprises a solution-soluble resin.

15. The method according to claim 1, wherein the solution-soluble resin is an alkali-soluble resin.

16. The method according to claim 1, wherein the intermittent pattern is an island-shaped or stripe-shaped pattern.

17. The method according to claim 16, wherein the island-shaped pattern is a dot pattern.

18. The method according to claim 1, wherein the tacky sheet is an adhesion type tacky sheet, and (c) comprises pasting the tacky sheet to the surface on the redistribution layer side of the first laminate to use the substrate sheet itself as the second support substrate.

19. The method according to claim 1, wherein the tacky sheet is a transfer type tacky sheet, and (c) comprises, prior to bonding of the first laminate and the second support substrate, pasting the tacky sheet to the second support substrate or the first laminate to transfer the soluble tacky layer to the second support substrate or the first laminate, and peeling off the substrate sheet.

\* \* \* \* \*